United States Patent
Eastman et al.

(10) Patent No.: US 11,300,330 B2
(45) Date of Patent: *Apr. 12, 2022

(54) ELECTROCALORIC HEAT TRANSFER SYSTEM

(71) Applicant: Carrier Corporation, Palm Beach Gardens, FL (US)

(72) Inventors: Scott Alan Eastman, Glastonbury, CT (US); Sergei F. Burlatsky, West Hartford, CT (US); Joseph V. Mantese, Ellington, CT (US); Wei Xie, East Hartford, CT (US); Subramanyaravi Annapragada, South Windsor, CT (US); Parmesh Verma, South Windsor, CT (US); Vadim V. Atrazhev, Moscow (RU); Vadim I. Sultanov, Moscow (RU)

(73) Assignee: CARRIER CORPORATION, Palm Beach Gardens, FL (US)

( * ) Notice: Subject to any disclaimer, the term of this patent is extended or adjusted under 35 U.S.C. 154(b) by 201 days.

This patent is subject to a terminal disclaimer.

(21) Appl. No.: 16/313,766

(22) PCT Filed: Jun. 27, 2016

(86) PCT No.: PCT/US2016/039609
§ 371 (c)(1),
(2) Date: Dec. 27, 2018

(87) PCT Pub. No.: WO2018/004518
PCT Pub. Date: Jan. 4, 2018

(65) Prior Publication Data
US 2019/0226727 A1    Jul. 25, 2019

(51) Int. Cl.
*F25B 21/00* (2006.01)
*C09K 5/14* (2006.01)
(Continued)

(52) U.S. Cl.
CPC ............ *F25B 21/00* (2013.01); *C08F 214/22* (2013.01); *C09K 5/14* (2013.01); *H01L 37/025* (2013.01);
(Continued)

(58) Field of Classification Search
None
See application file for complete search history.

(56) References Cited

U.S. PATENT DOCUMENTS

2007/0167590 A1 * 7/2007 Baras .................... C08F 214/22
526/249
2008/0081195 A1 * 4/2008 Chung ...................... C08J 3/28
428/421

(Continued)

FOREIGN PATENT DOCUMENTS

JP          59230208 A  * 12/1984

OTHER PUBLICATIONS

Derwent Abstract of JP 59230208 A, 1985. (Year: 1985).*

(Continued)

*Primary Examiner* — Nicole M. Buie-Hatcher
(74) *Attorney, Agent, or Firm* — Cantor Colburn LLP

(57) ABSTRACT

An electrocaloric element for a heat transfer system includes an electrocaloric material of a copolymer of (i) vinylidene fluoride, (ii) an addition polymerization monomer selected from tetrafluoroethylene, trifluoroethylene, vinyl fluoride, or combinations thereof, and (iii) a halogenated addition polymerization monomer larger than vinylidene fluoride. It is also provided that: (a) the monomer (ii) includes an addition polymerization monomer smaller than trifluoroethylene, (b) at least one of the addition polymerization monomers (ii) or (iii) is a chiral monomer, and the copolymer includes syndiotactic ordered segments of chiral monomer units, and/or (c) at least one of the addition polymerization (Continued)

monomers (ii) or (iii) comprises chlorine, and the copolymer includes an ordered distribution of monomer units comprising chlorine along the copolymer polymer backbone.

15 Claims, 1 Drawing Sheet

(51) Int. Cl.
*C08F 214/22* (2006.01)
*H01L 37/02* (2006.01)

(52) U.S. Cl.
CPC ......... *F25B 2321/001* (2013.01); *Y02B 30/00* (2013.01)

(56) References Cited

U.S. PATENT DOCUMENTS

| | | |
|---|---|---|
| 2011/0016885 A1 | 1/2011 | Zhang et al. |
| 2011/0228442 A1 | 9/2011 | Zhang et al. |
| 2012/0116039 A1* | 5/2012 | Bauer ............... C08F 14/22 526/249 |
| 2013/0090439 A1* | 4/2013 | Lu .................... C08F 14/18 526/170 |
| 2014/0139328 A1* | 5/2014 | Zellers ............... G06F 3/041 340/407.2 |
| 2014/0139329 A1* | 5/2014 | Ramstein ............ G08B 6/00 340/407.2 |
| 2014/0139436 A1* | 5/2014 | Ramstein ........... H01L 41/0926 345/168 |
| 2015/0027132 A1 | 1/2015 | Zhang et al. |
| 2015/0353700 A1 | 12/2015 | Isaka et al. |
| 2016/0076798 A1 | 3/2016 | Zhang et al. |
| 2016/0087185 A1 | 3/2016 | Cheng |
| 2019/0003746 A1* | 1/2019 | Xie ..................... H01L 37/025 |
| 2019/0003747 A1* | 1/2019 | Walker ............... F25B 21/00 |
| 2019/0003748 A1* | 1/2019 | Gorbounov ......... F25B 21/00 |
| 2019/0170409 A1 | 6/2019 | Eastman et al. |

OTHER PUBLICATIONS

International Search Report for International Application No. PCT/US2016/039609 dated Mar. 28, 2017, 6 pages.
Li et al. "Tunable temperature dependence of electrocaloric effect in ferroelectric relaxor poly (vinylidene fluoride-trifluoroethylene-chlorofluoroeth ylene terpolymer", Applied Physics Letters, A I P Publishing LLC, US, vol. 99 , No. 5, Aug. 3, 2011, p. 52907.
Written Opinion of International Searching Authority for International Application No. PCT/US2016/039609 dated Mar. 28, 2017, 8 pages.
International Search Report for international Application No. PCT/US2016/039620 dated Mar. 30, 2017; 6 Pages.
Li et al.; "Solution-Processed Ferroelectric Terpolymer Nanocomposites with High Breakdown Strength and Energy Density Utilizing Boron Nitride Nanosheets"; Energy & Environmental Science; Issue 8, No. 922; 2015; 11 Pages.
Ozbolt et al.; "Electrocaloric Refrigeration: Thermodynamics, State of the Art and Future Perspectives"; International Journal of Refrigeration; Issue 40; 2014; pp. 174-188.
Written Opinion for International Application No. PCT/US2016/039620 dated Mar. 30, 2017; 10 Pages.
Zhang et al.; "Ferroelectric Polymer Nanocomposites for Room-Termperature Electrocaloric Refrigeration"; Advanced Materials; Issue 27; 2015; pp. 1450-1454.

\* cited by examiner

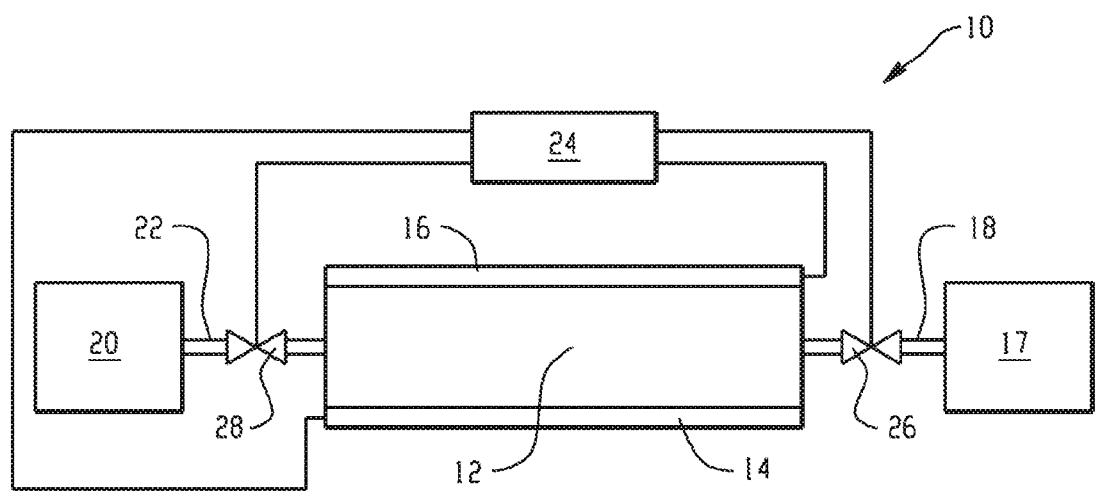

ELECTROCALORIC HEAT TRANSFER SYSTEM

CROSS-REFERENCE TO RELATED APPLICATIONS

This application claims the benefit of PCT/US2016/039609 filed Jun. 27, 2016, which is incorporated herein by reference in its entirety.

BACKGROUND

A wide variety of technologies exist for cooling applications, including but not limited to evaporative cooling, convective cooling, or solid state cooling such as electrothermic cooling. One of the most prevalent technologies in use for residential and commercial refrigeration and air conditioning is the vapor compression refrigerant heat transfer loop. These loops typically circulate a refrigerant having appropriate thermodynamic properties through a loop that comprises a compressor, a heat rejection heat exchanger (i.e., heat exchanger condenser), an expansion device and a heat absorption heat exchanger (i.e., heat exchanger evaporator). Vapor compression refrigerant loops effectively provide cooling and refrigeration in a variety of settings, and in some situations can be run in reverse as a heat pump. However, many of the refrigerants can present environmental hazards such as ozone depleting potential (ODP) or global warming potential (GWP), or can be toxic or flammable. Additionally, vapor compression refrigerant loops can be impractical or disadvantageous in environments lacking a ready source of power sufficient to drive the mechanical compressor in the refrigerant loop. For example, in an electric vehicle, the power demand of an air conditioning compressor can result in a significantly shortened vehicle battery life or driving range. Similarly, the weight and power requirements of the compressor can be problematic in various portable cooling applications.

Accordingly, there has been interest in developing cooling technologies as alternatives to vapor compression refrigerant loops.

BRIEF DESCRIPTION

In some embodiments of the disclosure, a heat transfer system comprises an electrocaloric material, which comprises a copolymer of a monomer mixture. The monomer mixture comprises (i) vinylidene fluoride, (ii) an addition polymerization monomer selected from tetrafluoroethylene, trifluoroethylene, or an addition polymerization monomer smaller than trifluoroethylene, and (iii) a halogenated addition polymerization monomer different than (i) or (ii) that is larger than vinylidene fluoride. Additionally, it is provided that: (a) the monomer (ii) comprises an addition polymerization monomer smaller than trifluoroethylene, (b) at least one of the addition polymerization monomers (ii) or (iii) is a chiral monomer, and the copolymer includes syndiotactic ordered segments of chiral monomer units, (c) at least one of the addition polymerization monomers (ii) or (iii) comprises chlorine, and the copolymer comprises an ordered distribution of monomer units comprising chlorine along the copolymer polymer backbone, or (d) combinations of any of (a) and (b), (a) and (c), (b) and (c), or (a) and (b) and (c). Electrodes are disposed on opposite surfaces of the electrocaloric material, and an electric power source is configured to provide voltage to the electrodes. The system also includes a first thermal flow path between the electrocaloric material and a heat sink, and a second thermal flow path between the electrocaloric material and a heat source.

In any one or combination of the foregoing embodiments, wherein the addition polymerization monomer (ii) comprises an addition polymerization monomer smaller than trifluoroethylene.

In any one or combination of the foregoing embodiments, the addition polymerization monomer (ii) comprises vinyl fluoride.

In any one or combination of the foregoing embodiments, the addition polymerization monomer (ii) comprises ethylene.

In any one or combination of the foregoing embodiments, the monomer mixture further comprises trifluoroethylene.

In any one or combination of the foregoing embodiments, at least one of the addition polymerization monomers (ii) or (iii) is a chiral monomer, and wherein the copolymer includes syndiotactic ordered segments of chiral monomer units.

In any one or combination of the foregoing embodiments, both monomers (ii) and (iii) are chiral.

In any one or combination of the foregoing embodiments, at least one of the addition polymerization monomers (ii) or (iii) comprises chlorine, and the copolymer comprises an ordered distribution of monomer units comprising chlorine along the copolymer polymer backbone.

In any one or combination of the foregoing embodiments, the ordered distribution of monomer units comprising chlorine includes segments of monomer units comprising chlorine having an ordered distribution.

In any one or combination of the foregoing embodiments, the copolymer comprises an ordered an ordered distribution of monomer units comprising chlorine along the entirety of the copolymer backbone.

In any one or combination of the foregoing embodiments, the ordered distribution of monomer units comprising chlorine along the polymer backbone comprises a uniform distribution of chlorine atoms along the polymer backbone.

In any one or combination of the foregoing embodiments, the addition polymerization monomer (iii) comprises chlorofluoroethylene or a halogenated addition polymerization monomer larger than chlorofluoroethylene.

In any one or combination of the foregoing embodiments, the addition polymerization monomer (iii) comprises chlorofluoroethylene.

In any one or combination of the foregoing embodiments, addition polymerization monomer (iii) comprises a monomer larger than chlorofluoroethylene.

In any one or combination of the foregoing embodiments, the monomer (iii) is selected from 2,3,3,3-tetrafluoropropylene, vinylidene chloride, and 1,1-difluoropropylene.

BRIEF DESCRIPTION OF THE DRAWINGS

Subject matter of this disclosure is particularly pointed out and distinctly claimed in the claims at the conclusion of the specification. The foregoing and other features, and advantages of the present disclosure are apparent from the following detailed description taken in conjunction with the accompanying drawings in which:

The FIGURE is a schematic depiction of an exemplary cooling system as described herein.

DETAILED DESCRIPTION

As mentioned above, the heat transfer system utilizes an electrocaloric material that is a copolymer of a monomer mixture comprising (i) vinylidene fluoride (VF), (ii) an addition polymerization monomer selected from tetrafluoroethylene, trifluoroethylene, or a monomer smaller than trifluoroethylene, and (iii) a halogenated addition polymerization monomer different than (ii) that is larger than vinylidene fluoride. In some embodiments, the monomer (ii) comprises TrFE. In some embodiments, the monomer (ii) comprises tetrafluoroethylene (TFE). In some embodiments, the monomer (ii) comprises a monomer smaller than TrFE, such as vinyl fluoride (VF) or ethylene. In some embodiments, the monomer (ii) comprises a combination of two or more of the above monomers. Examples of the monomer (iii) include but are not limited to chlorofluoroethylene (CFE), chlorotrifluoroethylene (CTFE), hexafluoropropylene (HFP), vinylidene chloride (VDC) 1,1-difluoropropylene (DFP), 2,3,3,3-tetrafluoropropylene (TFP). In some embodiments, the monomer (iii) comprises CFE or a halogenated monomer larger than CTFE. In some embodiments, the monomer (iii) comprises CFE. Examples of copolymers include, but are not limited to P(VDF-TrFE-CFE), P(VDF-TrFE-CTFE), P(VDF-TrFE-HFP), P(VDF-TrFE-TFE), P(VDF-TrFE-VDC), P(VDF-TFE-CFE), P(VDF-TFE-CTFE), P(VDF-TFE-HFP), P(VDF-TFE-VDC), P(VDF-TrFE-DFP), P(VDF-TrFE-TFP), P(VDF-VF-CFE), P(VDF-VF-TFP), P(VDF-TrFE-TFP), P(VDF-TrFE-VF-CFE), P(VDF-VF-CFE-TFP) and mixtures thereof. The amounts of the respective monomers in the copolymer can vary depending on desired properties of the copolymer. In some example embodiments, the monomer (i) can be present in an amount in a range having a low end of 45 mole %, more specifically 50 mole %, and more specifically 55 mole %, and an upper end of 75 mole %, more specifically 70 mole %, and more specifically 65 mole %. In some example embodiments, the monomer (ii) can be present in an amount in a range having a low end of 20 mole %, more specifically 22 mole %, and more specifically 25 mole %, and an upper end of 38 mole %, more specifically 35 mole %, and more specifically 33 mole %. In some example embodiments, the monomer (iii) can be present in an amount in a range having a low end of 2 mole %, more specifically 4 mole %, and more specifically 6 mole %, and an upper end of 12 mole %, more specifically 10 mole %, and more specifically 8 mole %. The above upper and lower range endpoints can be independently combined to disclose a number of different ranges.

As mentioned above, there is a proviso that in some embodiments that: (a) the monomer (ii) comprises an addition polymerization monomer smaller than trifluoroethylene, (b) at least one of the addition polymerization monomers (ii) or (iii) is a chiral monomer, and the copolymer includes syndiotactic ordered segments of chiral monomer units, (c) at least one of the addition polymerization monomers (ii) or (iii) comprises chlorine, and the copolymer comprises an ordered distribution of monomer units comprising chlorine along the copolymer polymer backbone, or (d) combinations of any of (a) and (b), (a) and (c), (b) and (c), or (a) and (b) and (c). With respect to the proviso (a), although the present disclosure is not limited to a particular mode or theory of operation, in some embodiments, sizing of the monomer (ii) smaller than TrFE can provide the technical effect of promoting formation of gauche dihedral structures and increasing the entropy of a conformational disordered phase exhibited by the copolymer in a paraelectric state when not exposed to an electric field. Higher entropy levels of the electrocaloric copolymer in the paraelectric state can promote larger changes in entropy upon application of an electric field, with accompanying larger temperature lifts. In some embodiments, monomers smaller than TrFE such as vinyl fluoride can be included in the copolymer as a sole source of monomer meeting the criteria of monomer (ii), exclusive of TrFE and TFE, in amounts as disclosed above for monomer (ii). In some embodiments, monomers smaller than TrFE such as vinyl fluoride or ethylene can be used in combination with other monomer(s) satisfying the criteria of monomer (ii), such as TFE and/or TrFE. In some embodiments, monomers smaller than TrFE can be used in combination a TrFE. When used in combination with TFE or TrFE, the monomer smaller than TrFE can account for a percentage 0% to 100% of the total amount of monomer (ii). In some embodiments, a monomer (ii) smaller than TrFE can be present in an amount in a range having a low end of 20 mole %, more specifically 22 mole %, and more specifically 25 mole %, and an upper end of 38 mole %, more specifically 35 mole %, and more specifically 33 mole %.

With respect to the proviso (b), although the present disclosure is not limited to a particular mode or theory of operation, in some embodiments the presence of syndiotactic ordered segments of chiral monomer units can have the technical effect of promoting a decrease in defects of various types of defects within the crystallite, and promoting a decrease in entropy exhibited by the copolymer in a ferroelectric state when exposed to an electric field. Lower entropy levels of the electrocaloric copolymer in the paraelectric state can promote larger changes in entropy between the paraelectric state and the ferroelectric state upon application of an electric field, with accompanying larger temperature lifts. In some embodiments, monomer (ii) comprises chiral monomers. In some embodiments, monomer (iii) comprises chiral monomers. In some embodiments, both monomers (ii) and (iii) comprise chiral monomers. As used herein a molecular segment is considered syndiotactic if at least 50% of the monomers in the segment are in a syndiotactic configuration. The degree of tacticity of the polymer can vary. In some embodiments, at least 25% of the chiral monomer units in the polymer are in a syndiotactic configuration with other monomers. In some embodiments, at least 50% of the chiral monomer units are disposed in a syndiotactic configuration, and in some embodiments at least 75% of the chiral monomer units are disposed in a syndiotactic configuration.

Syndiotactic segments in halogenated addition polymers can be formed by various techniques. Tacticity of the non-vinylidene monomer can be obtained through specific chemistries that drive tacticity of the other monomers such as chlorotrifluoroethylene (CTFE). Homopolymerization of CTFE can produce majority syndiotactic polymer via free radicle initiation. Incorporating CTFE or other monomer unites PVDF via co-radicle polymerization can yield syndiotactic CTFE repeat units. The chlorine or equivalent moiety can then be reduced to convert to a trifluoroethylene monomer that has the same tacticity of the previous CTFE or equivalent monomer. One effective reducing agent for CTFE is tributyl tin hydride. Similar synthetic methods can be used to incorporate conformational defects such as head to head and tail to tail chain conformational defects. By using bulky vinyl groups where the bulky chemical moieties such as halogens or other larger moieties are attached to the same carbon of a vinyl group, these defects can be controlled when copolymerized with vinylidene fluoride monomer. These chain conformational defects can manipulate the electrocaloric behavior of the material they tend to disrupt the chain mobility within the resulting crystal, including but not limited to selection of polymerization catalyst, chain transfer agents. Additional techniques for synthesizing syndiotactic polymers are disclosed by F. Boschet et al., Chem. Rev. 2014, 114(2) pp. 927-980; W. J. Feast, J. of Fluorine Chem., vol. 100, issues 1-2, 12/99, pp. 117-125; or S. Lu et al., Tetrahedron Letters, vo. 41, issue 22, June 2000, pp. 4493-4497.

With respect to proviso (c), although the present disclosure is not limited to a particular mode or theory of operation, in some embodiments, an ordered distribution of monomer units comprising chlorine along the copolymer backbone can have the technical effect of promoting a narrower electrocaloric transition. If the transition is broader than the total temperature change in the system, there is electrocaloric effect that is essentially not being utilized (i.e. reduction in electrocaloric efficiency). If the transition is narrow enough that it is completely within the range of temperatures seen in the system during operation, the electrocaloric efficiency of the material is maximized. In some embodiments, the ordered distribution of chlorine-containing monomer units can be a uniform distribution (i.e., a repeating substantially equal number of monomer repeat units between adjacent chlorine-containing monomer units). In some embodiments, the ordered distribution of chlorine-containing monomer units is exhibited by a portion of the copolymer or in multiple segments of the copolymer. In some embodiments, the ordered distribution of chlorine-containing monomer units is exhibited along the entirety of the copolymer. Distribution of chlorine-containing monomers along the copolymer backbone can be achieved by synthesizing oligomers from the non-chlorine containing monomer(s), and reacting the oligomers with the chlorine-containing monomers under conditions to promote attachment of the chlorine-containing monomers to the oligomer chain (e.g., a stoichiometric excess of oligomer), and then further controlled chain extension to assemble copolymer macromolecules having a controlled distribution of chlorine-containing monomer along the copolymer backbone.

The addition polymerization reaction to form the electrocaloric copolymers can be performed using various addition polymerization techniques and combinations of techniques, including but not limited to emulsion polymerization, telomerisation, controlled addition polymerization. Various additives can be included in the reaction mixture, such as emulsifiers, aqueous and organic solvents, free radical initiators, chain transfer agents, etc. In some embodiments, an electric field or space- or time-differentiated pattern of electric fields can be applied to the reaction mixture during polymerization to impact the crystal structure of the polymer, or the alignment of the molecules or dipoles on the molecules. In some embodiments, the electrocaloric material can be made by the dissolving or dispersing the electrocaloric copolymer(s) in an organic solvent to form a liquid composition, casting the liquid composition onto a substrate, evaporating the solvent to form an electrocaloric film, and removing the electrocaloric film from the substrate. In some embodiments, the solvent(s) can have a boiling point of less than 100° C., more specifically less than 80° C., and even more specifically 70° C. In some embodiments, the solvent can have a boiling point of at least 50° C., more specifically 55° C., and even more specifically 60° C. It is understood that these upper and lower range limits can be independently combined to disclose a number of different possible ranges. As used herein, unless otherwise explicitly stated boiling point means boiling point at 1 atmosphere pressure. Although this disclosure is not bound by any particular mechanism or theory, rapid solvent evaporation from low boiling point solvents, low pressure during evaporation, or both, can in some embodiments promote high density, low porosity, and formation of crystalline domains in the polymer matrix that promote beneficial electrocaloric performance.

With respect to the solvent, any organic solvent within the specified boiling point range can be used. In some embodiments, a polar organic solvent is used, and can in some aspects provide compatibility with the polarity of the electrocaloric polymer. In other embodiments, a non-polar organic solvent can be used. Mixtures of polar and non-polar organic solvents can also be used. Examples of solvents include but are not limited to tetrahydrofuran (THF), butanone (i.e., methylethyl ketone or MEK), chlorobenzene, supercritical $CO_2$.

The concentration of the electrocaloric polymer in a solvent coating composition can vary widely, depending on the type of coating technique and the desired dried thickness of the coating. In some embodiments, the electrocaloric polymer content range from a lower endpoint of 0.1 wt. %, more specifically 1 wt. %, to an upper endpoint of 50 wt. %, more specifically 20 wt. %, based on the total weight of the coating composition, it being understood that the above endpoints can be independently combined to yield a number of different ranges.

In some embodiments, forming and solidifying the film can comprise forming a thermoplastic fluid melt comprising the electrocaloric copolymer, forming a film of the thermoplastic fluid melt, and cooling to solidify the film. In some embodiments, the thermoplastic fluid melt can be extruded as a film into a cooling medium, blow-molded using film-forming blow-molding techniques, or coated onto a substrate.

In some embodiments, a method of making a heat transfer system comprises making an electrocaloric element according to any one or combination of the above method embodiments, and further comprising providing a heat flow path between the electrocaloric element and a heat source or a heat sink for controlled heat transfer between the electrocaloric element and the heat source or heat sink.

In some embodiments, the cast fluid composition can be subjected to a constant or a varying electric field during casting, evaporation, annealing, or physical manipulation (e.g., stretching) to impact the alignment of the polymer macromolecules and polar substituents in crystalline domains. After the film is dried and removed from the substrate, it can optionally be subjected to an annealing process by heating. The electrocaloric material can be subjected to various processing other protocols to promote or otherwise impact the electrocaloric effect of the material or other properties. In some embodiments, the solid film can be subjected to stretching or other physical manipulations (before, during, or after annealing), which can impact the alignment of the polymer macromolecules and polar substituents in crystalline domains.

The fluid copolymer composition can include additives and coating aids such as surfactants, lubricants, substrate release agents, stabilizers, antioxidants, and others can be included. Various substrates can be used, including but not limited to glass, polished stainless steel, or solvent-resistant polymers (polytetrafluoroethylene) or polymers that are dissolvable in solvents other than the solvent used for coating the electrocaloric polymer (e.g., polypropylene). Release of the electrocaloric film can be facilitated by functionalization of the substrate using low surface-energy liquids such as polyorganosiloxanes or by dissolving a polymer substrate in a solvent that doesn't dissolve the coated electrocaloric film (e.g., a non-polar organic solvent). In some embodiments, the substrate can include an additive such as a nucleating agent at the interface surface with the copolymer, for example solid particle nucleating agents on the substrate surface or in the substrate at the surface, or pre-treatment of the substrate surface with a solution or dispersion of a molecular nucleating agent.

An example embodiment of a heat transfer system and its operation are further described with respect to the FIGURE. As shown in the FIGURE, a heat transfer system 10 comprises an electrocaloric element comprising an electrocaloric polymer film 12 having electrodes 14 and 16 on opposite sides thereof. Multiple electrocaloric elements configured in a stack can also be used. The electrocaloric element is in thermal communication with a heat sink 17 through a first thermal flow path 18, and in thermal communication with a heat source 20 through a second thermal flow path 22. The thermal flow paths are described below with respect thermal transfer through flow of a heat transfer fluid through control valves 26 and 28 between the electrocaloric element and the heat sink and heat source, but can also be through conductive heat transfer through solid state heat thermoelectric switches in thermally conductive contact with the electrocaloric element and the heat source or heat sink, or thermomechanical switches in movable to establish thermally conductive contact between the electrocaloric element and the heat source or heat sink. A controller 24 serves as an electrical power source and is configured to control electrical current to through a power source (not shown) to selectively activate the electrodes 14, 16. The controller 24 is also configured to open and close control valves 26 and 28 to selectively direct the heat transfer fluid along the first and second flow paths 18 and 22.

In operation, the system 10 can be operated by the controller 24 applying an electric field as a voltage differential across the electrocaloric element to cause a decrease in entropy and a release of heat energy by the electrocaloric elements. The controller 24 opens the control valve 26 to transfer at least a portion of the released heat energy along flow path 18 to heat sink 17. This transfer of heat can occur after the temperature of the electrocaloric elements has risen to a threshold temperature. In some embodiments, heat transfer to the heat sink 17 is begun as soon as the temperature of the electrocaloric elements increases to be about equal to the temperature of the heat sink 17. After application of the electric field for a time to induce a desired release and transfer of heat energy from the electrocaloric elements to the heat sink 17, the electric field can be removed. Removal of the electric field causes an increase in entropy and a decrease in heat energy of the electrocaloric elements. This decrease in heat energy manifests as a reduction in temperature of the electrocaloric elements to a temperature below that of the heat source 20. The controller 24 closes control valve 26 to terminate flow along flow path 18, and opens control device 28 to transfer heat energy from the heat source 20 to the colder electrocaloric elements in order to regenerate the electrocaloric elements for another cycle.

In some embodiments, for example where a heat transfer system is utilized to maintain a temperature in a conditioned space or thermal target, the electric field can be applied to the electrocaloric elements to increase its temperature until the temperature of the electrocaloric element reaches a first threshold. After the first temperature threshold, the controller 24 opens control valve 26 to transfer heat from the electrocaloric elements to the heat sink 17 until a second temperature threshold is reached. The electric field can continue to be applied during all or a portion of the time period between the first and second temperature thresholds, and is then removed to reduce the temperature of the electrocaloric elements until a third temperature threshold is reached. The controller 24 then closes control valve 26 to terminate heat flow transfer along heat flow path 18, and opens control valve 28 to transfer heat from the heat source 20 to the electrocaloric elements. The above steps can be optionally repeated until a target temperature of the conditioned space or thermal target (which can be either the heat source or the heat sink) is reached.

The systems described herein can be operated in a cooling mode where the heat source is a conditioned space or cooling target. The systems described herein can also be operated in a heat pump mode where the heat sink is a conditioned space or heating target. It should also be noted that the described systems are exemplary in nature and that modifications can of course be made. For example, a single controller 24 is in the FIGURE, but control could be provided by distributed control or smart components such as temperature-sensitive heat transfer control devices. Also, although the systems are depicted with a single electrocaloric material and electrode assembly, it is understood by the skilled person that connected banks or arrays of elements can be used as well.

While the present disclosure has been described in detail in connection with only a limited number of embodiments, it should be readily understood that the present disclosure is not limited to such disclosed embodiments. Rather, the present disclosure can be modified to incorporate any number of variations, alterations, substitutions or equivalent arrangements not heretofore described, but which are commensurate with the spirit and scope of the present disclosure. Additionally, while various embodiments of the present disclosure have been described, it is to be understood that aspects of the present disclosure may include only some of the described embodiments. Accordingly, the present disclosure is not to be seen as limited by the foregoing description, but is only limited by the scope of the appended claims.

The invention claimed is:

1. A heat transfer system, comprising
an electrocaloric material comprising:
   a copolymer of a monomer mixture comprising:
     (i) vinylidene fluoride,
     (ii) an addition polymerization monomer selected from tetrafluoroethylene, trifluoroethylene, or an addition polymerization monomer smaller than trifluoroethylene, and
     (iii) a halogenated addition polymerization monomer other than tetrafluoroethylene or trifluoroethylene that is different than (i) or (ii) and is larger than vinylidene fluoride; and
electrodes disposed on opposite surfaces of the electrocaloric material;
a first thermal flow path between the electrocaloric material and a heat sink;
a second thermal flow path between the electrocaloric material and a heat source; and
an electric power source configured to provide voltage to the electrodes;
wherein at least one of the addition polymerization monomers (ii) or (iii) is a chiral monomer, and wherein the copolymer includes syndiotactic ordered segments of chiral monomer units.

2. The heat transfer system of claim 1, wherein the addition polymerization monomer (ii) comprises an addition polymerization monomer smaller than trifluoroethylene.

3. The heat transfer system of claim 2, wherein the addition polymerization monomer (ii) comprises vinyl fluoride.

4. The heat transfer system of claim 2, wherein the addition polymerization monomer (ii) comprises ethylene.

5. The heat transfer system of claim 2, wherein the monomer mixture further comprises trifluoroethylene.

6. The heat transfer system of claim 1, wherein both monomers (ii) and (iii) are chiral.

7. The heat transfer system of claim 1, wherein at least one of the addition polymerization monomers (ii) or (iii) comprises chlorine, and the copolymer comprises an ordered distribution of monomer units comprising chlorine along the copolymer polymer backbone.

8. The heat transfer system of claim 7, wherein the ordered distribution of monomer units comprising chlorine includes segments of monomer units comprising chlorine having an ordered distribution.

9. The heat transfer system of claim 7, wherein the copolymer comprises an ordered an ordered distribution of monomer units comprising chlorine along the entirety of the copolymer backbone.

10. The heat transfer system of claim 7, wherein the ordered distribution of monomer units comprising chlorine along the polymer backbone comprises a uniform distribution of chlorine atoms along the polymer backbone.

11. The heat transfer system of claim 1, wherein the addition polymerization monomer (iii) comprises chlorofluoroethylene or a halogenated addition polymerization monomer larger than chlorofluoroethylene.

12. The heat transfer system of claim 11, wherein the addition polymerization monomer (iii) comprises chlorofluoroethylene.

13. The heat transfer system of claim 11, wherein addition polymerization monomer (iii) comprises a monomer larger than chlorofluoroethylene.

14. The heat transfer system of claim 13, wherein the monomer (iii) is selected from 2,3,3,3-tetrafluoropropylene, vinylidene chloride, and 1,1-difluoropropylene.

15. The heat transfer system of claim 1, wherein the addition polymerization monomer (ii) comprises vinyl fluoride and the monomer (iii) is selected from 2,3,3,3-tetrafluoropropylene, vinylidene chloride, and 1,1-difluoropropylene.

\* \* \* \* \*